(12) United States Patent
Chang et al.

(10) Patent No.: US 8,125,619 B2
(45) Date of Patent: Feb. 28, 2012

(54) INTEGRATED AMBIENT LIGHT SENSOR AND DISTANCE SENSOR

(75) Inventors: Tom Chang, Los Altos, CA (US); John Canfield, Union City, CA (US)

(73) Assignee: Eminent Electronic Technology Corp., Hsinchu (TW)

( * ) Notice: Subject to any disclaimer, the term of this patent is extended or adjusted under 35 U.S.C. 154(b) by 80 days.

(21) Appl. No.: 12/220,578

(22) Filed: Jul. 25, 2008

(65) Prior Publication Data

US 2009/0027652 A1  Jan. 29, 2009

Related U.S. Application Data

(60) Provisional application No. 60/962,057, filed on Jul. 25, 2007, provisional application No. 61/003,099, filed on Nov. 13, 2007.

(51) Int. Cl.
*G01C 3/08* (2006.01)

(52) U.S. Cl. ...................................... 356/4.01; 356/5.01

(58) Field of Classification Search ................. 356/4.01, 356/5.01
See application file for complete search history.

(56) References Cited

U.S. PATENT DOCUMENTS 7,148,078 B2    12/2006  Moyer et al.
(Continued)

OTHER PUBLICATIONS

International Search Report and Written Opinion in PCT/US09/05752 dated Dec. 23, 2009.

(Continued)

*Primary Examiner* — Isam Alsomiri
(74) *Attorney, Agent, or Firm* — McDonnell Boehnen Hulbert & Berghoff LLP

(57) ABSTRACT

An integrated proximity and light sensor includes an indicating light-emitting device ("ILD"), a projecting light-emitting device ("PLD"), and a light sensing integrated circuit ("LSIC") configured as a single package. The LSIC controls each of the ILD and the PLD to emit light therefrom and the LSIC is configured to detect an ambient light level and also to detect a reflection of the light projected by the PLD from a surface for proximity detection.

15 Claims, 5 Drawing Sheets

U.S. PATENT DOCUMENTS

| | | | |
|---|---|---|---|
| 7,235,773 | B1 | 6/2007 | Newman |
| 7,265,397 | B1 | 9/2007 | Tower et al. |
| 7,268,858 | B2 * | 9/2007 | Kuijk et al. ............... 356/5.01 |
| 7,486,386 | B1 * | 2/2009 | Holcombe et al. .......... 356/4.01 |
| 7,623,221 | B2 * | 11/2009 | Thun et al. ................. 356/5.06 |
| 2002/0109215 | A1 | 8/2002 | Iwaya et al. |
| 2004/0070745 | A1 * | 4/2004 | Lewis et al. ............... 356/5.01 |
| 2004/0149036 | A1 | 8/2004 | Foxlin et al. |
| 2005/0041758 | A1 * | 2/2005 | Rosen ........................ 375/316 |
| 2005/0087675 | A1 | 4/2005 | Ayres |
| 2005/0122507 | A1 * | 6/2005 | Detweiler et al. ......... 356/141.1 |
| 2005/0162646 | A1 | 7/2005 | Tedesco et al. |
| 2006/0044267 | A1 | 3/2006 | Xie et al. |
| 2006/0128087 | A1 | 6/2006 | Bamji et al. |
| 2006/0164533 | A1 | 7/2006 | Hsieh et al. |
| 2007/0085157 | A1 | 4/2007 | Fadell et al. |
| 2007/0102738 | A1 | 5/2007 | Adkisson et al. |
| 2008/0006762 | A1 | 1/2008 | Fadell et al. |
| 2008/0136336 | A1 | 6/2008 | Kalnitsky et al. |
| 2008/0167834 | A1 | 7/2008 | Herz et al. |
| 2008/0304790 | A1 | 12/2008 | Minamio et al. |
| 2010/0043706 | A1 * | 2/2010 | Jung et al. ................. 118/712 |

OTHER PUBLICATIONS

International Search Report and Written Opinion for PCT/US2010/21499, dated Mar. 2, 2010.

* cited by examiner

INTEGRATED AMBIENT LIGHT SENSOR AND DISTANCE SENSOR

CROSS REFERENCE TO RELATED APPLICATIONS

This application claims the benefit of U.S. Provisional Patent Application Nos. 60/962,057 filed Jul. 25, 2007, and 61/003,099 filed Nov. 13, 2007. Each of the aforesaid applications is hereby incorporated by reference herein in its entirety.

REFERENCE REGARDING FEDERALLY SPONSORED RESEARCH OR DEVELOPMENT

Not applicable

SEQUENTIAL LISTING

Not applicable

BACKGROUND OF THE INVENTION

1. Technical Field

This invention relates generally to the control of power supplied to a light source and other functions in an electronic device and, more particularly, to the use of light sensors to control the power supplied to such light source and the operation of such functions.

2. Description of the Background

Portable electronic devices, such as cellular phones and personal digital assistants, commonly include displays that are illuminated to facilitate interaction with a user. One challenge that arises with the illumination of such displays is the requirement to conserve energy in order to prolong battery life. Therefore, it is generally desirable to minimize power used to illuminate the display. However, it is also desirable to provide sufficient illumination to the display so that a user can operate the device in varying ambient light levels. In addition, to further prolong battery life, it is also desirable to illuminate the display only when a user is detected in a certain proximity to the device.

Therefore, a need has arisen for suitable sensors that can be integrated with existing electronic devices and that can be used to sense ambient light conditions and for proximity detection.

In one example of a prior device, an integrated circuit package includes a light source and an integrated circuit die with a sensor. The light source and the sensor are angled such that light emitted from the light source illuminates the field of view of the sensor. A single-piece substrate of the integrated circuit package has a nonlinear surface that defines the desired light source-to-sensor angle. The nonlinear surface includes one or more sharp bends or regions of curvature to provide the target relationship between illumination and sensing. The integrated circuit die is fixed to a first area of the single-piece substrate, while the light source is fixed to a second area. In this example, manufacturing costs are increased due to the requirement of a nonlinear surface to define the necessary angles. Further, the integrated circuit package is not used to sense ambient light conditions.

In another example of a prior device, an integrated proximity and light sensor includes an infrared light source and an infrared light detector. In this example, the infrared light detector senses infrared light emitted by the light source and reflected off of objects for proximity detection and further senses infrared light when the light source is turned off for ambient light detection. However, the use of infrared light for ambient light detection does not adequately match visible ambient light seen by the human eye, and therefore, an electronic device that incorporates such a sensor may not provide sufficient illumination to a display so that a user can operate the device in varying ambient light levels.

SUMMARY OF THE INVENTION

One aspect of the present disclosure is to provide a sensor that integrates a silicon-based integrated circuit ("IC") sensing device, i.e., a light sensor IC ("LSIC"), an indicating light-emitting device ("ILD"), such as a light emitting diode ("LED") or a laser-diode, and a projecting light-emitting device ("PLD"). The architecture of the sensor allows the sensor to perform multiple optoelectronic functions. Such optoelectronic functions may include one or all of the following functions, providing an indicator light, ambient light sensing, proximity sensing, and user presence detection.

It is another aspect of the present disclosure that the LSIC controls the timing of each optoelectronic function to provide a single physically integrated package that provides multiple measurement and detecting functions. Furthermore, the LSIC also controls the ILD to assure accurate ambient light and proximity detection measurements are carried out without interference from light emitted from the ILD.

It is another aspect of the present invention that the mechanical design of the package provides a structural feature that isolates light emitted by the ILD and/or PLD from the LSIC to substantially prevent light saturation of the LSIC such that accurate and sustainable light sensing operations are maintained.

It is another aspect of the present invention that a transparent or semi-transparent structure, (such as a plastic lens, or optical flat) is part of the package for containing and housing the device to allow the light-emitting device to emit light into the surrounding environment and the sensor to sense light from the surrounding environment.

In one embodiment, an integrated proximity and light sensor includes an ILD, a PLD, and an LSIC configured as a single package. The LSIC controls each of the ILD and the PLD to emit light therefrom and the LSIC is configured to detect an ambient light level and also to detect a reflection of the light projected by the PLD from a surface for proximity detection.

In another embodiment, an integrated proximity and light sensor includes a PLD and an LSIC configured as a single package and a light isolation partition that optically isolates the PLD from the LSIC. The LSIC controls the PLD to emit light therefrom and the LSIC is configured to detect an ambient light level and also to detect a reflection of the light projected by the PLD from a surface for proximity detection.

In yet another embodiment, a method of operating an integrated proximity and light sensor includes the steps of programming a controller to operate the integrated proximity and light sensor in at least two modes including an ambient light sensing mode and a proximity sensing mode. The proximity sensing mode further includes the steps of turning on a PLD, detecting light while the PLD is on to obtain first data, turning off the PLD, detecting light while the PLD is off to obtain second data, and determining the proximity of a surface as a function of the difference between the first data and the second data.

Other aspects and advantages will become apparent upon consideration of the following detailed description.

DETAILED DESCRIPTION OF THE PREFERRED EMBODIMENTS

Figure 1B:
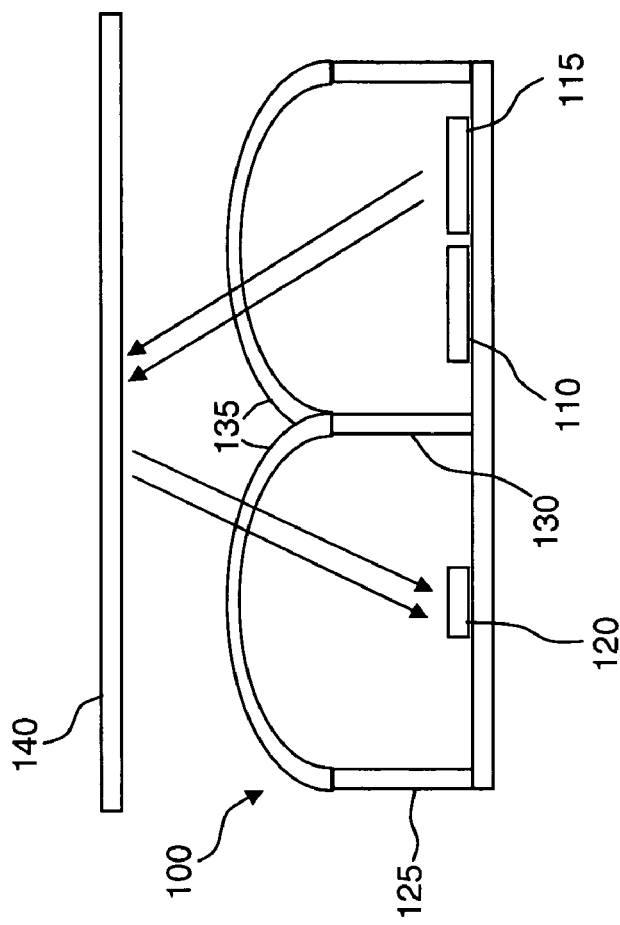
FIGS. 1A and 1B are plan and cross-sectional views of an integrated proximity and light sensor.
Figure 1A:
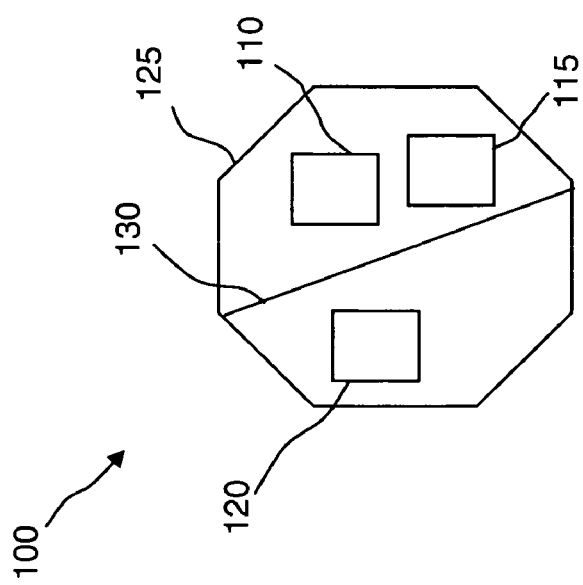

FIGS. 1A and 1B illustrate an integrated proximity and light sensor 100 that integrates one or more indicating light-emitting devices ("ILD's") 110, a projecting light emitting device ("PLD") 115, and a light sensing integrated circuit ("LSIC") 120. In the present embodiment, the ILD 110, PLD 115, and LSIC 120 are enclosed in a protective light-isolation housing 125. The protective light-isolation housing 125 includes a light isolation partition 130 that separates the LSIC 120 from the PLD 115. In other embodiments, the ILD 110 and PLD 115 are also optically isolated from each other by a light isolation partition (not shown). The protective light-isolation housing 125 further includes one or more optics ports 135 disposed above a top surface thereof. The optics ports 135 may include lenses, optical flats, or other designs apparent to a person of skill in the art, and may be made from any material, such as glass or plastic, which is transparent or semitransparent to light in some or all of the relevant ranges of wavelengths. In various embodiments, the PLD 115 can be a light emitting diode ("LED") that emits visible and/or infrared light, a vertical cavity surface emitting laser chip ("VCSEL"), or any other type of light emitting device that would be apparent to one or ordinary skill in the art. Further, in the present embodiment, the ILD 110 is a device that emits visible light, such as, an LED, a multiple LED array, a laser LED, an organic LED, and the like. The configuration of FIGS. 1A and 1B allows the sensor 100 to be placed in locations in an electronic device where an existing indicator LED might have been placed. In other words, is makes it easier to implement the sensor 100 into existing electronic devices.

The wavelengths of light emitted from the ILD 110 and PLD 115 may be the same or different, although it is more likely that they would be different. In one embodiment, the ILD 110 emits light in the visible range and the PLD 115 emits light in the infrared range. In any case, the protective light-isolation housing 125 and the light isolation partition 130 should minimize the leakage of light between different light-emitting devices and sensing components, e.g., the ILD 110, the PLD 115, and the LSIC 120, as would be apparent to one of ordinary skill in the art.

A reflective surface 140 is illustrated in FIG. 1B to show one embodiment of the operation of the sensor 100 for proximity detection. In the present embodiment, the proximity of an object, represented as the reflective surface 140, is detected by sensing light reflected from the reflective surface 140. More particularly, the PLD 115 emits light that is reflected from the reflective surface 140 and sensed by the LSIC 120. As a reflective surface 140 only needs to reflect some of the light back towards the detector, it may absorb some of the light, and it may scatter the light as well. For example it can be a Lambertian reflector like a surface of paper, skin, or fabric. The amount of light the reflective surface 140 reflects back towards the LSIC 120 is sensed to determine the presence of the object within a given distance range of the sensor 100 and/or to determine the distance of the object from the sensor 100. The LSIC 120 may also combine digital and/or analog components to process the sensed light and to determine the distance of the object from the sensor 100 using methods known to a person of ordinary skill in the art.

Figure 2:
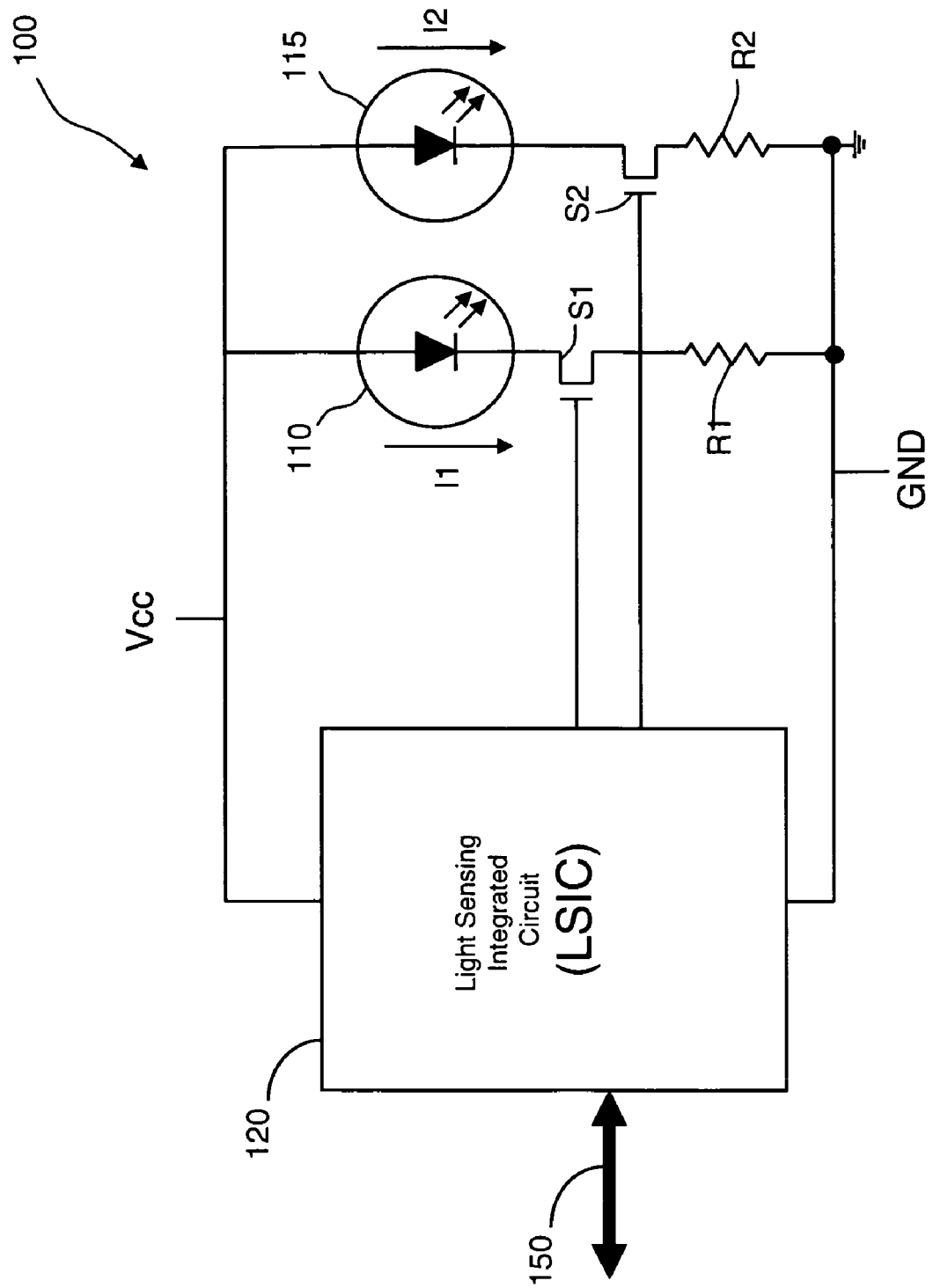
FIG. 2 is a combination block and circuit diagram of the integrated proximity and light sensor of FIGS. 1A and 1B.

Referring to FIG. 2, another example of the integrated proximity and light sensor 100 also includes the ILD 110, the PLD 115, and the LSIC 120. The sensor 150 further includes the LSIC 120 coupled between a high voltage Vcc and a low voltage, e.g., a ground voltage GND. The LSIC 120 connects to a gate electrode of a first switch S1 coupled to the ILD 110 and also to a gate electrode of a second switch S2 coupled to the PLD 115. The LSIC 120 sends a control signal to the gate electrode of the first switch S1 to turn the first switch on and cause an input current I1 to flow through the ILD 110 and a first current limiting resistor R1. The input current I1 causes the ILD 110 to emit light, as would be apparent to one of ordinary skill. Similarly, the LSIC 120 sends a control signal to the gate electrode of the second switch S2 to turn the second switch on and cause an input current I2 to flow through the PLD 115 and a second current limiting resistor R2, wherein the input current I2 causes the PLD 115 to emit light. In the present embodiment, the switches S1, S2 are transistors. However, in other embodiments, other types of switches can be used as would be apparent to one of ordinary skill in the art. The sensor 100 further illustrates a digital data bus 150 for connecting the sensor 100 to an electronic device (not shown)

Figure 3:
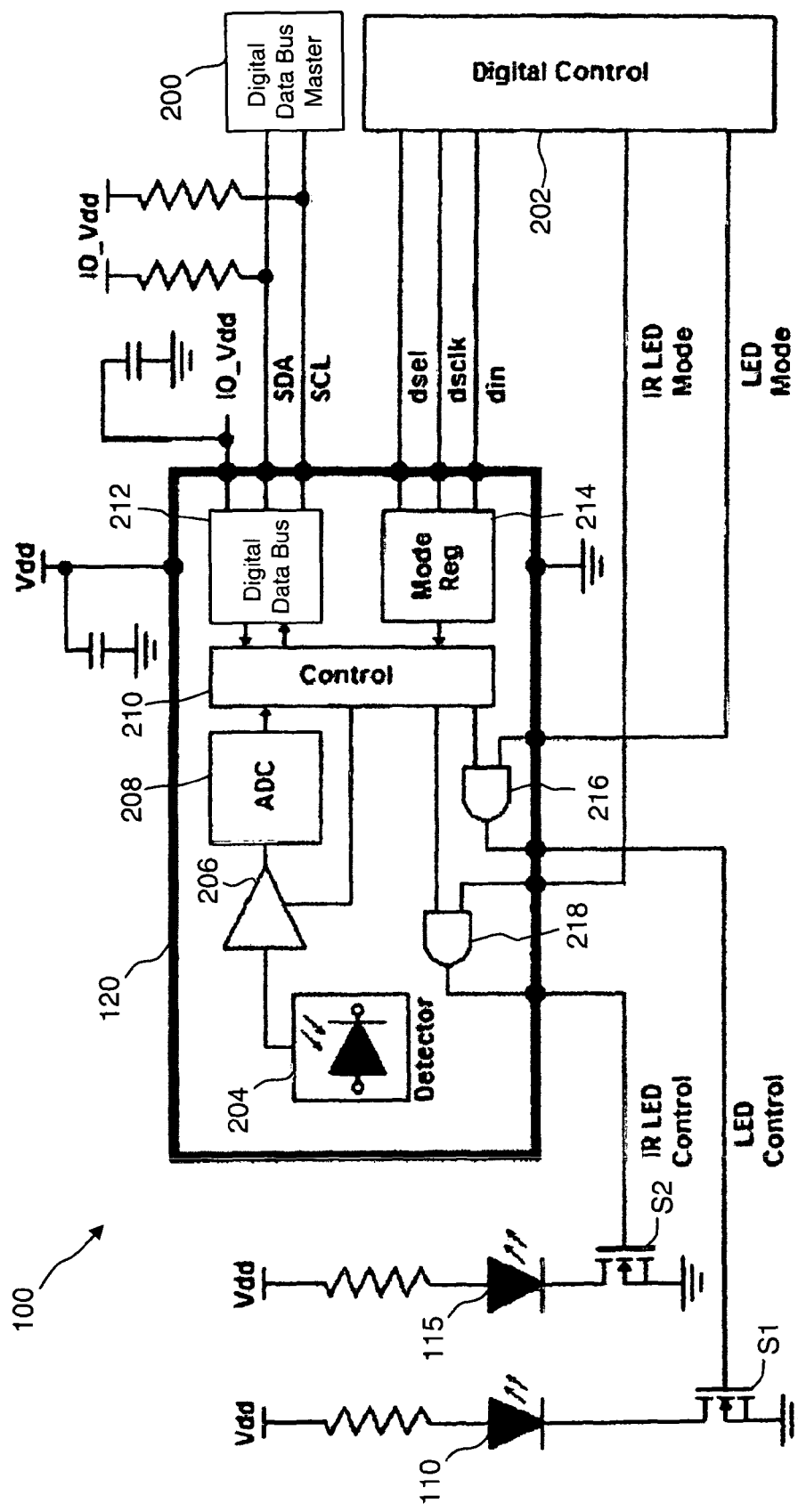
FIG. 3 is a circuit diagram of the integrated proximity and light sensor of FIGS. 1A and 1B illustrating further details of a light sensing integrated circuit and various components of an electronic device.

FIG. 3 illustrates an embodiment of the integrated proximity and light sensor 100 that is connected to various components of an electronic device. More particularly, the electronic device of FIG. 3 generally includes a digital data bus master 200 and a digital control 202 that together control the operation of the sensor 100 and the reading/writing of data to and from the sensor 100, as would be apparent to one of ordinary skill in the art. In the present embodiment, the LSIC 120 further includes one or more detectors 204, such as photodiodes or phototransistors, that are adapted to detect visible and infrared light and generate signals that represent the detection of light. In one embodiment, the LSIC 120 is configured to detect visible light for ambient light detection and infrared light for proximity detection. In this manner, the ambient light detection can more closely match the sensitivity of a human eye, while the proximity detection can use infrared light that will not be seen by a user. The detector is coupled to an amplifier 206, which amplifies the signals from the detector 204 and supplies the amplified signals to an analog-to-digital converter ("ADC") 208. The ADC 208 coverts the analog signals from the amplifier 206 into digital signals and supplies the digital signals to a control 210. The control 210 is further coupled to a digital data bus 212 and a mode register 214. The digital data bus 212 and mode register 214 are further coupled to the digital bus master 200 and the digital control 202 of the electronic device. The LSIC 120 further includes first and second AND gates 216, 218, respectively. A first input of the first AND gate 216 is coupled to the digital control 202 of the electronic device and a second input of the first AND gate 216 is coupled to the control 210 of the LSIC 120. An output of the first AND gate 216 is further coupled to the first switch S1 to control the operation thereof. Similarly, a first input of the second AND gate 218 is coupled to the digital control 202 of the electronic device and a second input of the second AND gate 218 is coupled to the control 210 of the LSIC 120. An output of the second AND gate 218 is further coupled to the second switch S2 to control the operation thereof. In this manner, the control 210 of the LSIC 120 can override control signals from the digital control 202 of the electronic device so that the sensor 100 can be operated to sense ambient light and to detect proximity. For example, the control 210 can send a control signal to the ILD 110 to illuminate same continuously while the electronic device is on. However, as will be described in more detail hereinafter, at times, the control 210 of the LSIC 120 will turn off the ILD 110 in order to sense ambient light and/or to detect proximity.

Figure 4:
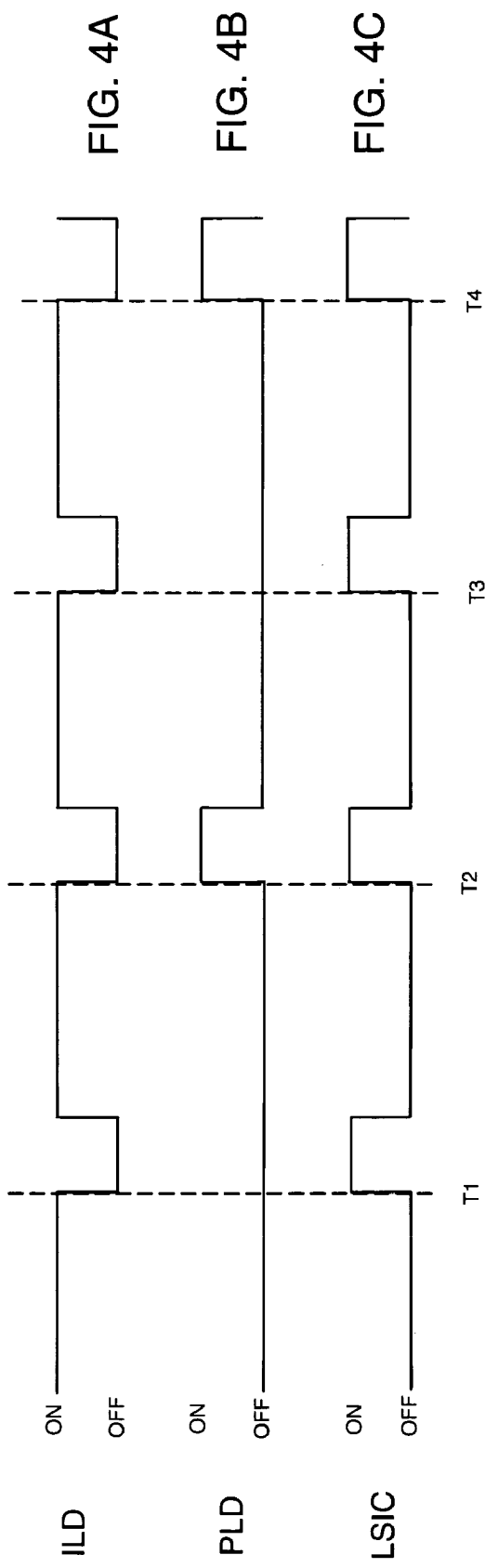
FIGS. 4A, 4B, and 4C show control waveforms that can be implemented to control light-emitting devices and the light sensing integrated circuit of the integrated proximity and light sensor of FIGS. 1A and 1B.

FIGS. 4A-4C illustrate a control sequence for operating the ILD 110, the PLD 115, and the LSIC 120 of any of the embodiments disclosed herein. In one embodiment, the LSIC 120 is programmed with the control sequence of FIGS. 4A-4C to control the various components of the integrated proximity and light sensor 100. However, in other embodiments, external components, such as the digital control 202 described above, may also be programmed to control the sensor 100. In FIGS. 4A-4C, the ILD 110 is turned on to operate as an indicator light and is turned off periodically while the LSIC 120 is turned on to either sense an ambient light level or to detect proximity. For example, at a time T1, the ILD 110 and the PLD 115 are off and the LSIC 120 is on to sense an ambient light level. The time that the LSIC 120 is turned on to sense the ambient light level is referred to as the integration time, which can be a variable length of time, as would be apparent to one of ordinary skill in the art. More specifically, during the integration time, the LSIC 120 integrates the received light impinging on the detector, e.g., detector 204 of FIG. 3, over the integration time to collect data that corresponds to the ambient light level. In one embodiment, the control 210 of FIG. 3 performs the integration. However, in other embodiments, other components of the sensor 100 and/or the electronic device can be configured to perform the integration. In a further embodiment, the integration time is a small fraction of the overall on time of the ILD 110. For example, in one embodiment, the integration time is between about one microsecond to about 30 milliseconds. After the integration time has elapsed, the ILD 110 can be turned on again to provide a visual indication of a status of an electronic device. As a result, the LSIC 120 can control the ILD 110 to appear to be continuously on while periodically sensing the ambient light level. In a similar manner, the LSIC 120 controls the ILD 110 and the PLD 115 for proximity detection. At a time T2, the ILD 110 is off and the PLD 115 and the LSIC 120 are on to detect proximity, wherein light emitted by the PLD 115 is reflected from a surface and received by the LSIC 120. Thereafter, the received light is integrated as described above to collect data for proximity detection. In FIGS. 4A-4C, the control sequence periodically repeats the steps of sensing ambient light and detecting proximity. More specifically, at a time T3 after T2 the ILD 110 is turned off and the LSIC 120 is turned on to sense the ambient light level and at subsequent time T4 the ILD 110 is turned off and the PLD 115 and the LSIC 120 are turned on to detect proximity. Other modifications to the control sequence of FIGS. 4A-4C can be made, as would be apparent to one of ordinary skill.

Figure 5:
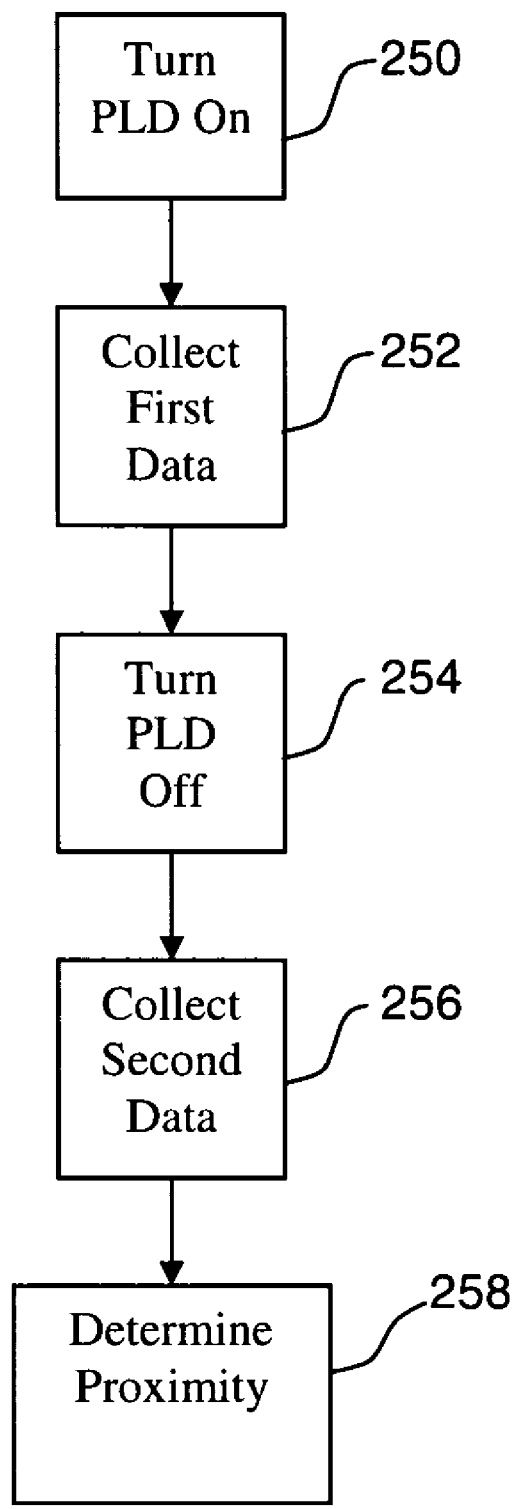
FIG. 5 illustrates a flowchart of programming that can be executed by a control of FIG. 3 to detect proximity and/or ambient light using the integrated proximity and light sensor of the previous FIGS.

Referring to FIG. 5, a flowchart of steps executed for proximity detection begins at a block 250, wherein the PLD 115 is turned on. Next, control passes to a block 252 and the LSIC 120 senses light emitted from the PLD 115 and reflected from a surface to collect first data. In one embodiment, the PLD 115 is turned on for a predetermined amount of time before the LSIC 120 begins sensing light and the PLD 115 is turned off after a predetermined amount of time after the LSIC 120 stops sensing light. For example, the predetermined amount of time can be between about 1 to about 20 microseconds. Following the block 252, control passes to a block 254 and the PLD 115 is turned off. Next, control passes to a block 256 and, while the PLD 115 is off, the LSIC 120 senses ambient light to collect second data. Following the block 256, control passes to a block 258 and a proximity of the surface is detected. More specifically, the proximity of the surface is determined as a function of the difference between the first data, which corresponds to light reflected from the surface, and the second data, which corresponds to background ambient light. In one embodiment, an equation for the proximity as a function of the first and second data is $Z=AX+BY$, wherein Z represents the proximity, X represents the first data, Y represents the second data, and A and B are constants. The values of A and B can be determined through various tests or software modest as would be apparent to one of ordinary skill in the art. Because the value Z is calculated as a function of the difference between the first and second data, the constant B can be a negative value or the addition operation can be changed to a subtraction operation. In one embodiment, the light that is emitted and sensed is infrared light. However, in other embodiments, light in other spectral ranges can be used.

The integrated proximity and light sensor described herein can be used in a variety of different applications. For example, in a smart phone, an LCD back-light can be turned off when the sensor detects that the phone is next to a user's ear. In addition, the sensor can be used to determine if the phone is in the user's pocket to turn off most of the operations of the phone. In another example, the sensor is used in a touch-panel display to detect the approach of a finger to cause a pop-up menu or a soft keyboard to appear on the display. In yet another example, a backlight for any type of display, such as an LCD monitor, is adjusted automatically based on the ambient light level. In passenger entertainment systems on a plane, bus, taxi, etc., the sensor can detect the presence or absence of a passenger to turn a display on or off automatically. The sensor can also be used in a kiosk, such as a bank ATM, an airline check-in station, or other registration kiosk, wherein the sensor detects the presence of user to cause a display to show a start page and detects the absence of the user to turn off the display and save power. Further, the sensor can be used as an input device. For example, if a user's finger passes above the sensor twice in a second, it could mean a specific command, such as changing from a web surfing mode to phone mode. Further, the integrated proximity and light sensor described herein can be used in other applications, as would be apparent to a person of ordinary skill in the art.

INDUSTRIAL APPLICABILITY

An improved configuration and method for integrating a light sensor and proximity sensor in a single package is disclosed. The integrated light and proximity sensor can also include and one or more light-emitting devices, wherein the integrated sensor and light-emitting device(s) simplify incorporation and integration of such components into electronic devices, such as personal digital assistants, cellular phones, kiosks, walkie-talkies, and the like. Further, in battery-operated devices with displays, especially self-illuminated displays, the integrated light sensor and light-emitting device(s) can be used to optimize lighting of such displays and achieve savings in battery power for portable electronic devices.

Numerous modifications to the present invention will be apparent to those skilled in the art in view of the foregoing description. Accordingly, this description is to be construed as illustrative only and is presented for the purpose of enabling those skilled in the art to make and use the invention and to teach the best mode of carrying out same. The exclusive rights to all modifications which come within the scope of the appended claims are reserved.

We claim:

1. An integrated proximity and light sensor, comprising:
   a projecting light-emitting device ("PLD"), an indicating light emitting device ("ILD"), and a light sensing integrated circuit ("LSIC") configured as a single package; and
   a light isolation partition that optically isolates the PLD from the LSIC,
   wherein the LSIC controls the PLD and the ILD to emit light therefrom,
   and wherein the LSIC is configured to detect an ambient light level and also to detect a reflection of the light projected by the PLD from a surface for proximity detection, further wherein the LSIC turns off the ILD to detect the ambient light level and/or for proximity detection.

2. The integrated proximity and light sensor of claim 1, wherein the LSIC controls the ILD to emit visible light therefrom and controls the PLD to emit infrared light therefrom.

3. The integrated proximity and light sensor of claim 2, wherein the ILD further includes one or more light-emitting diodes and the PLD further includes an infrared light-emitting diode.

4. The integrated proximity and light sensor of claim 1, further comprising first and second switches coupled to the LSIC by first and second logic gates, respectively, wherein the first switch controls a first current passing through the ILD and the second switch controls a second current passing through the PLD, wherein each of the first and second logic gates includes first and second inputs, and wherein the first input is configured to be coupled a control of the LSIC and the second input is configured to be coupled to a control of an electronic device.

5. The integrated proximity and light sensor of claim 1 further comprising one or more optical ports disposed above the light isolation partition, wherein light projected from the ILD and/or the PLD transmits through the one or more optical ports.

6. The integrated proximity and light sensor of claim 1, wherein the LSIC includes one or more sensors that sense visible light to detect the ambient light level and sense infrared light for proximity detection.

7. The integrated proximity and light sensor of claim 6, wherein the one or more sensors are photodiodes.

8. The integrated proximity and light sensor of claim 1, wherein the LSIC is coupled to first and second switches, and wherein the first switch controls a first current passing through the ILD and the second switch controls a second current passing through the PLD.

9. The integrated proximity and light sensor of claim 8, wherein the first switch includes a first transistor with a first gate connected to and controlled by the LSIC and the second switch includes a second transistor with a second gate connected to and controlled by the LSIC.

10. The integrated proximity and light sensor of claim 1, wherein the LSIC turns off the ILD for a time period shorter than about 30 milliseconds to detect the ambient light level.

11. The integrated proximity and light sensor of claim 1, wherein the LSIC turns off the ILD for a time period shorter than 30 millisecond and turns on the PLD for a time period shorter than 30 millisecond to detect the reflection of the light projected by the PLD from the surface for proximity detection.

12. A method of operating an integrated proximity and light sensor, comprising the steps of:
   utilizing a controller programmed to operate the integrated proximity and light sensor in at least two modes including an ambient light sensing mode and a proximity sensing mode, wherein the proximity sensing mode further includes the steps of:
   turning on a projecting light-emitting device ("PLD");
   detecting light while the PLD is on to obtain first data;
   turning off the PLD;
   detecting light while the PLD is off to obtain second data; and
   determining the proximity of a surface as a function of the difference between the first data and the second data;
   and wherein the controller is further programmed to turn on an indicating light-emitting device ("ILD") and to turn off the ILD periodically when the integrated proximity and light sensor is sensing ambient light and/or proximity.

13. The method of operating an integrated proximity and light sensor of claim 12, wherein the PLD device is turned on for a predetermined time before and after the first step of detecting, and wherein the PLD is turned off for a predetermined time before and after the second step of detecting.

14. The method of operating an integrated proximity and light sensor of claim 12, wherein the ILD emits visible light and the PLD emits infrared light.

15. The method of operating an integrated proximity and light sensor of claim 12, wherein the ambient light sensing mode further includes sensing visible light and the proximity sensing mode further includes sensing infrared light.

* * * * *